US009773824B2

(12) United States Patent
Shieh et al.

(10) Patent No.: US 9,773,824 B2
(45) Date of Patent: Sep. 26, 2017

(54) ACTIVE MATRIX LIGHT EMITTING DIODE ARRAY AND PROJECTOR DISPLAY COMPRISING IT

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 15/087,716

(22) Filed: Mar. 31, 2016

(65) Prior Publication Data

US 2016/0218128 A1 Jul. 28, 2016

Related U.S. Application Data

(63) Continuation-in-part of application No. 14/620,910, filed on Feb. 12, 2015, now Pat. No. 9,397,282, which
(Continued)

(51) Int. Cl.
*H01L 27/146* (2006.01)
*H01L 27/12* (2006.01)
(Continued)

(52) U.S. Cl.
CPC .... *H01L 27/14609* (2013.01); *H01L 27/1225* (2013.01); *H01L 27/1248* (2013.01);
(Continued)

(58) Field of Classification Search
CPC ............. H01L 27/14609; H01L 27/156; H01L 27/1463; H01L 27/14663; H01L 27/14692; H01L 27/14603; H01L 33/1262
See application file for complete search history.

(56) References Cited

U.S. PATENT DOCUMENTS 4,785,186 A * 11/1988 Street .................. G01T 1/24
250/370.01
2004/0135944 A1* 7/2004 Kim .................. G02F 1/133514
349/113
(Continued)

FOREIGN PATENT DOCUMENTS

IL                EP 825651      * 8/1997

*Primary Examiner* — Benjamin Sandvik
*Assistant Examiner* — Farid Khan
(74) *Attorney, Agent, or Firm* — Parsons & Goltry; Robert A. Parsons; Michael W. Goltry

(57) ABSTRACT

A method of fabricating a pixelated imager and structure including a substrate with a bottom contact layer and active element blanket layers deposited on the bottom contact layer. The blanket layers are separated into an array of active elements with trenches isolating adjacent active elements in the array. A dielectric passivation/planarization layer is positioned over the array of active elements. An array of active element readout circuits overlies the passivation/planarization layer above the trenches with one active element readout circuit coupled to each active element of the array of active elements. Each active element and coupled active element readout circuit defines a pixel and the array of active elements and the coupled array of active element readout circuits defines a pixelated imager, and the readout circuit coupled to each active element includes at least one TFT with an active channel comprising a metal-oxide semiconductor material.

37 Claims, 12 Drawing Sheets

Related U.S. Application Data is a continuation-in-part of application No. 13/713,744, filed on Dec. 13, 2012, now Pat. No. 8,962,377.

(51) Int. Cl.
| | |
|---|---|
| *H01L 33/00* | (2010.01) |
| *H01L 33/44* | (2010.01) |
| *H01L 33/46* | (2010.01) |
| *H01L 33/62* | (2010.01) |
| *H01L 33/64* | (2010.01) |
| *H01L 27/15* | (2006.01) |

(52) U.S. Cl.
CPC ...... *H01L 27/1262* (2013.01); *H01L 27/1463* (2013.01); *H01L 27/14603* (2013.01); *H01L 27/14663* (2013.01); *H01L 27/14692* (2013.01); *H01L 27/156* (2013.01); *H01L 33/0075* (2013.01); *H01L 33/44* (2013.01); *H01L 33/46* (2013.01); *H01L 33/62* (2013.01); *H01L 33/642* (2013.01); *H01L 2933/0025* (2013.01); *H01L 2933/0033* (2013.01); *H01L 2933/0066* (2013.01); *H01L 2933/0075* (2013.01)

(56) References Cited

U.S. PATENT DOCUMENTS

| | | | | |
|---|---|---|---|---|
| 2007/0018075 | A1* | 1/2007 | Cazaux | H01L 27/14609 250/208.1 |
| 2010/0271524 | A1* | 10/2010 | Venezia | H01L 27/14601 348/308 |
| 2011/0024642 | A1* | 2/2011 | Tredwell | G01T 1/2018 250/370.09 |
| 2012/0261656 | A1* | 10/2012 | Shu | G01J 1/42 257/43 |
| 2013/0082184 | A1* | 4/2013 | Nakatsugawa | A61B 6/4208 250/366 |
| 2013/0292573 | A1* | 11/2013 | Antonuk | H01L 27/1462 250/361 R |
| 2014/0035082 | A1* | 2/2014 | Chu | H01L 27/1463 257/432 |

\* cited by examiner

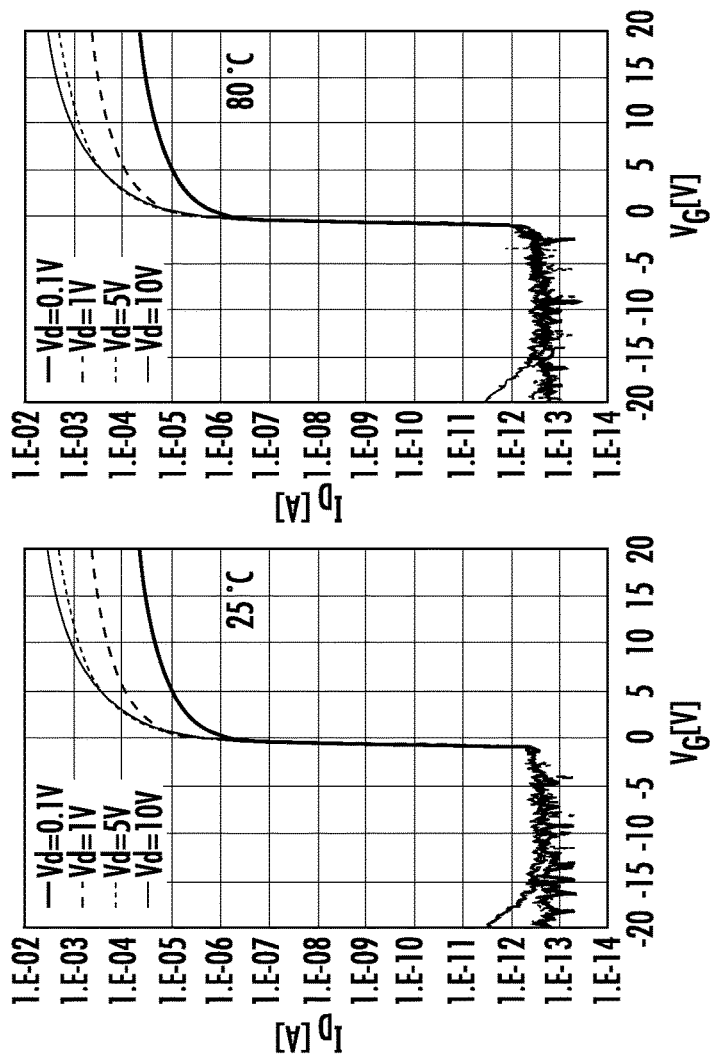

ACTIVE MATRIX LIGHT EMITTING DIODE ARRAY AND PROJECTOR DISPLAY COMPRISING IT

CROSS-REFERENCE TO RELATED APPLICATION

This application is a Continuation-in Part of U.S. patent application Ser. No. 14/620,910, filed 12 Feb. 2015, which is a continuation in part of U.S. patent application Ser. No. 13/713,744, filed 13 Dec. 2012, now issued U.S. Pat. No. 8,962,377 B2.

FIELD OF THE INVENTION

This invention generally relates to active matrix light emitting/sensing (active) diode arrays which convert input electric signals to output emitting light graphs and projectors comprising such display.

BACKGROUND OF THE INVENTION

In U.S. patent application Ser. No. 13/713,744 (now issued U.S. Pat. No. 8,962,377 B2), imaging array devices with metal-oxide thin-film-transistor (MOTFT) pixel readout circuits over PIN photodetector arrays were disclosed. Similar device architecture and process flow can also be used for making display devices in which each pixel comprises a MOTFT pixel driver circuit constructed with a MOTFT over a light emitting display element made in a PIN stack.

Recently, the emission efficiency of GaN LEDs has been improved rapidly to over 150 lm/W and it has become an ideal light source for projector displays due to its long operation lifetime compared with the gas discharge lamp. However, using LEDs to replace the gas discharge lamp is limited by the size of the LED. It is hard to make a large uniform LED source that can work with a flat liquid crystal display (LCD) or digital micro-mirror display (DMD) engine. The major issues are current crowding and the loss of homogeneity as the LED gets larger. The present invention uses an array of LEDs to overcome these issues. Because of the patterning into individual small LEDs (<100 microns), there are no issues of current crowding and inhomogeneity in driving the LEDs. The LED array consists of M×N LEDs where each LED can be driven independently to create the image. Each LED is very small and efficient without current crowding. To generate 5000 lm in a projector, assuming efficiency of 100 lm/W, one needs 50 W and 16 A of current (3V for GaN based PIN emission junction). Using current density of 10 A/cm$^2$, only an effective emission area of 1.6 cm$^2$ is needed. So the emitter array can be made in a very small area. Assuming a moderate fill factor (emitting area within each display pixel) of 30%, less than 5 cm$^2$ of GaN area is needed. The 10 A/cm$^2$ driving current is well below what the GaN LED is capable of (at 100 A/cm$^2$). So the capability to increase the luminance by another factor of 10; i.e., 50000 lm, is possible. When such active matrix LED display (AMLED) is used in a projector for a Movie Theater or for an outdoor display at brightness of 500 cd/m$^2$, over 100 square meter screen can be covered. Such AMLED is, thus, capable of providing an extremely high power projector. A key challenge for such a high power density projector is to dissipate the heat. The heat removal through thermal conduction alone is difficult because of the other requirements: the heat spreading material in such a device has to be transparent. The best transparent heat spreader is the SiC or GaN substrate that are used to grow the GaN LED. Sapphire is also transparent, but its heat spreading capability (23 W/m-K) is much smaller than SiC (120 W/m-K) or GaN (130 W/m-K). GaN has the additional benefit of lattice matching and enables better quality crystal growth. GaN can also be grown on Si, but it is not transparent and the substrate has to be removed in order to optimize its optoelectronic performance.

Another challenge is to provide an active matrix to drive the large array of M×N individual LEDs. There are two solutions to this problem. One solution is to make m×n connections to Si driver chips by solder bumps. Besides the solder bump yield is challenging to make the millions of connections, there is another serious problem in using a Si chip right on top of the GaN LED array. The high temperature of the GaN LED junction may cause the Si IC to malfunction. The leakage current of a-Si field effect transistor (FET) increases rapidly with temperature because of its lower bandgap (1.1 eV). To make the active matrix work, for such small pixel size, the FET leakage current has to be very small due to the limited size of storage capacitance. FETs based on silicon wafer are thus difficult for such high power density, high temperature applications.

The other solution is to make an active matrix directly on GaN LED wafers using TFT technology of higher bandgap to solve the leakage current problem as disclosed in detail in this invention. The leakage current of a high bandgap MOTFT is not strongly dependent on temperature and can be kept small at temperature even above 100° C. (Gang Yu, IMID 2014). Also a high bandgap MOTFT can be made directly on top of a GaN LED and there is no need to use the low yield solder bump to make the millions of connection.

It would be highly advantageous, therefore, to remedy the foregoing and other deficiencies inherent in the prior art.

Accordingly, it is an object of the present invention to provide high pixel density, active matrix LED arrays for high power projector display.

It is another object of the present invention to provide an AMLED display with a MOTFT pixel driver circuit on top of a PIN LED array without a solder bonding layer.

It is another object of the present invention to provide an AMLED display with improved thermal conduction, improved current density and improved output optical power.

It is another object of the present invention to provide a new and improved process for fabricating an active matrix light emitting/sensing array with a metal-oxide thin film transistor (MOTFT) array.

It is another object of the present invention to provide a new and improved process for fabricating AMLED arrays using a fewer number of process steps.

It is another object of the present invention to provide a new and improved process for fabricating AMLED arrays with high pixel counts and high pixel density for large screen projectors used in indoor and outdoor applications.

It is another object of the present invention to provide a new and improved process for fabricating an AMLED array without a solder bond layer and with improved operation stability.

It is another object of the present invention to provide a new and improved process for fabricating AMLED displays with more pixels and with smaller pixel pitch.

SUMMARY OF THE INVENTION

The desired objects of the instant invention are achieved in accordance with an embodiment of a method of fabricating a pixelated imager. The method including the step of providing a substrate with a bottom contact layer and active element blanket layers deposited or grown on the bottom contact layer. The method further including separating the active element blanket layers into an array of active elements with trenches isolating adjacent active elements in the array and forming a dielectric passivation/planarization layer over the active element array. An array of active element readout circuits is formed overlying the passivation/planarization layer above the trenches, one active element readout circuit of the array of active element readout circuits coupled to each active element of the array of active elements, wherein the readout circuit coupled to each active element includes at least one thin film transistor with an active channel comprising a metal-oxide semiconductor material.

The desired objects of the instant invention are also achieved in accordance with a specific embodiment in which a structure including a pixelated imager comprises a substrate with a bottom contact layer and active element blanket layers deposited on the bottom contact layer. The active element blanket layers are separated into an array of active elements with trenches isolating adjacent active elements in the array and a dielectric passivation/planarization layer is positioned over the array of active elements. An array of active element readout circuits overlies the passivation/planarization layer above the trenches, one active element readout circuit of the array of active element readout circuits coupled to each active element of the array of active elements. Each active element and coupled active element readout circuit defines a pixel and the array of active elements and the coupled array of active element readout circuits defines a pixelated imager. The readout circuit coupled to each active element includes at least one thin film transistor with an active channel comprising a metal-oxide semiconductor material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 9A and 9B, illustrate graphs of Id-Vgs of a TFT with w/l=6'6 for Vds=0.1 v, 1.0 v, 5.0 v, and 10 v at 25° C. and 80° C., respectively;

DETAILED DESCRIPTION OF THE DRAWINGS

In U.S. patent application Ser. No. 13/713,744 (now issued U.S. Pat. No. 8,962,377 B2), imaging array devices with metal-oxide thin-film-transistor (MOTFT) pixel readout circuits over PIN photodetector arrays were disclosed. In such devices, the pixel readout circuit layer is fabricated directly on the PIN photodiode array. Basically, the light illumination can be from the top or the bottom. For example, if the substrate of the PIN diodes is not transparent, e.g. germanium or silicon photodiodes, the illumination can only come from the top. In the present description, top illumination is described for convenience. In a typical example for an X-ray imager, the X-ray scintillator film or layer which converts x-rays to visible rays is laminated to the top surface instead of to the bottom surface. This arrangement is due to the fact that the substrate separates the scintillator film from the detector and the thickness of the substrate can reduce the resolution.

Also, with top illumination, a transparent top electrode is required for the PIN photodiode array. In a typical a-Si or poly-Si TFT, the transparent electrode requires one or more extra steps to deposit a transparent conductor, such as indium-tin-oxide (ITO). Another, issue with the bottom photodiode approach is the coupling capacitance of the data and gate lines to the photodiode common electrode. To reduce or substantially eliminate this capacitance a thick low-k dielectric must be positioned between the data and gate lines and the photodiode common electrode. In the prior art including the thick dielectric required additional process steps.

There have been reports of a micro-LED display made with welding a patterned LED array with a Si wafer based pixel driving circuit (J. Day, J. Li, D. Y. C. Lie, C Bradford, J. Y Lin, and H. X. Jiang, III-Nitride full-scale high-resolution microdisplays, Appl. Phys. Lett. 99, p. 031116, 2011). However, to the experts in the field, it is challenging to make the millions of connections with flip-chip process. Yield and reliability are the top two issues to be dealt with. There is another serious problem in using a Si chip right on top of the GaN LED array. The high temperature of the GaN LED junction may cause the Si IC to malfunction. The leakage current of Si increases rapidly with temperature because of its lower bandgap (1.1 eV). To make the active matrix work, for such small pixels, the leakage current has to be very small because the storage capacitance is very small. But the low bandgap of Si makes this approach difficult. Because of this, the test pixel current used in the paper referred above was only 1uA. The display was only intended to be used for micro-displays for near-eye application rather than for a projector operating at high current density. The device structure and the process disclosed in this application provide an unique approach for high power density projector display operate-able in broad temperature range.

Figure 1:
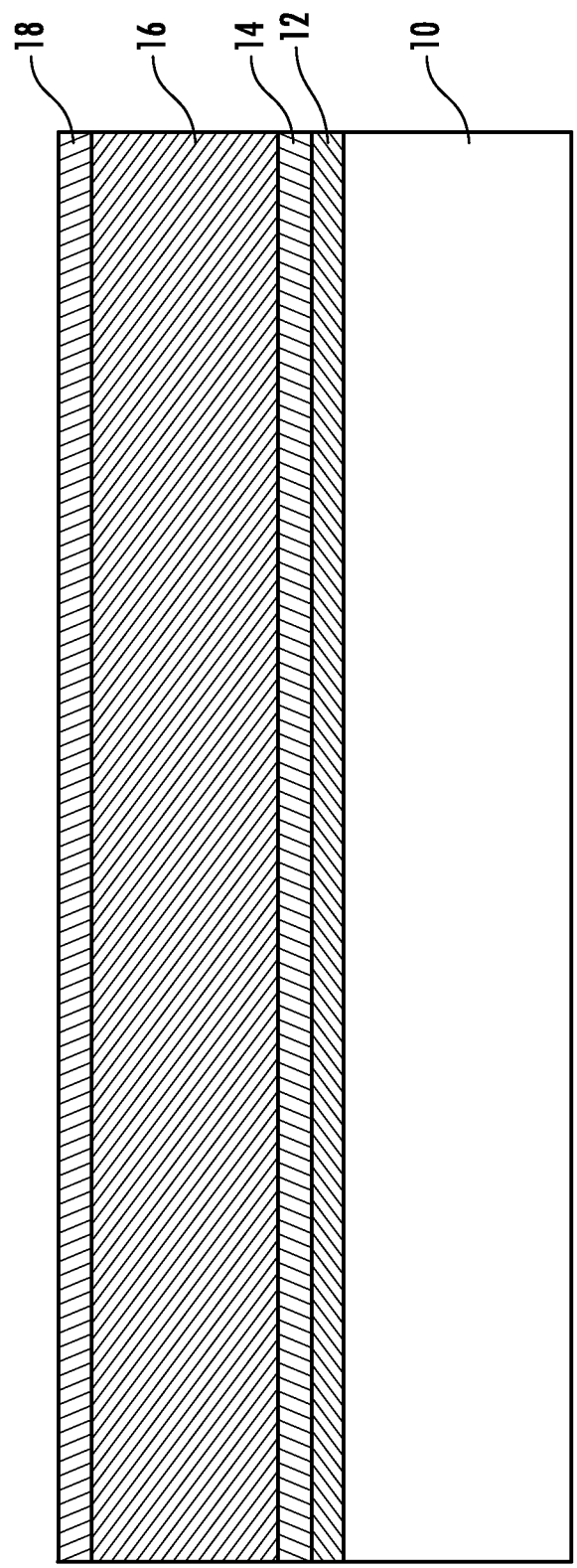
FIGS. 1 through 7 show simplified layer diagrams illustrating intermediate structures in a simplified process for fabricating imagers in accordance with the present invention.

Referring specifically to FIG. 1, a substrate 10 is illustrated with a bottom metal electrode 12 formed thereon. As will be understood from the following description, bottom metal electrode 12 is a common electrode for a photodiode array fabricated thereon. In many cases, a non-patterned metal or doped semiconductor electrode can be used. In some special cases for high pixel counts, or for further reducing the capacitive coupling between the bottom common electrode and the top column/row electrode lines. The bottom common electrode can be patterned in two-dimensional grid form so as to leave most of the area underneath the top column/row grid electrode lines open. For simplicity and explicitly, bottom electrode 12 in FIG. 1 is drawn in continuous form reflecting either un-patterned form, or in the continuous area in patterned form. The corresponding mask step is not counted in the following process flow.

A first semiconductor layer 14 is deposited on electrode 12 and may be either n or p type conductivity. A layer 16 of intrinsic semiconductor material is deposited on layer 14 and a layer 18 of opposite conductivity material (i.e. p or n) is deposited on layer 16. It will be understood that the three layers form a sensing element or in this case a PIN diode detector (photodiode), which is a preferred embodiment for its efficiency. However, if simple p/n diodes are sufficient, intrinsic layer 16 can simply be omitted. In either process, layers 12, 14, 16, and 18 are contact and p-i-n photodiode blanket layers, or sensing element blanket layers, deposited over substrate 10 and no masks are required.

The sensing element blanket layers can be in either crystalline or amorphous form. Examples of materials that can be included in the sensing element blanket layers in the p-i-n stacks include silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or their combinations in either amorphous or crystalline form. Take crystalline germanium, or Ge-Si alloy as an example, doped crystal can be used as the substrate directly, the insulating i layer can be formed by de-doping or by reverse-doping with opposite valance elements. For the visible image array, amorphous silicon (a-Si) p-i-n stack can be formed directly by PECVD process.

In addition to (or instead of) the p-i-n photodiode array, other sensing elements can be formed with a sensing function layer sandwiched between the top and bottom electrodes. For example, a thermal image array can be formed with a thermo-electric layer in the sensing area. In another example, a large size, ultrasonic sound wave detector array can be formed when a piezoelectric layer is used between the top and bottom electrodes. Also, as mentioned above, a scintillator film for an x-ray imager can be formed in the sensing area.

Figure 2:
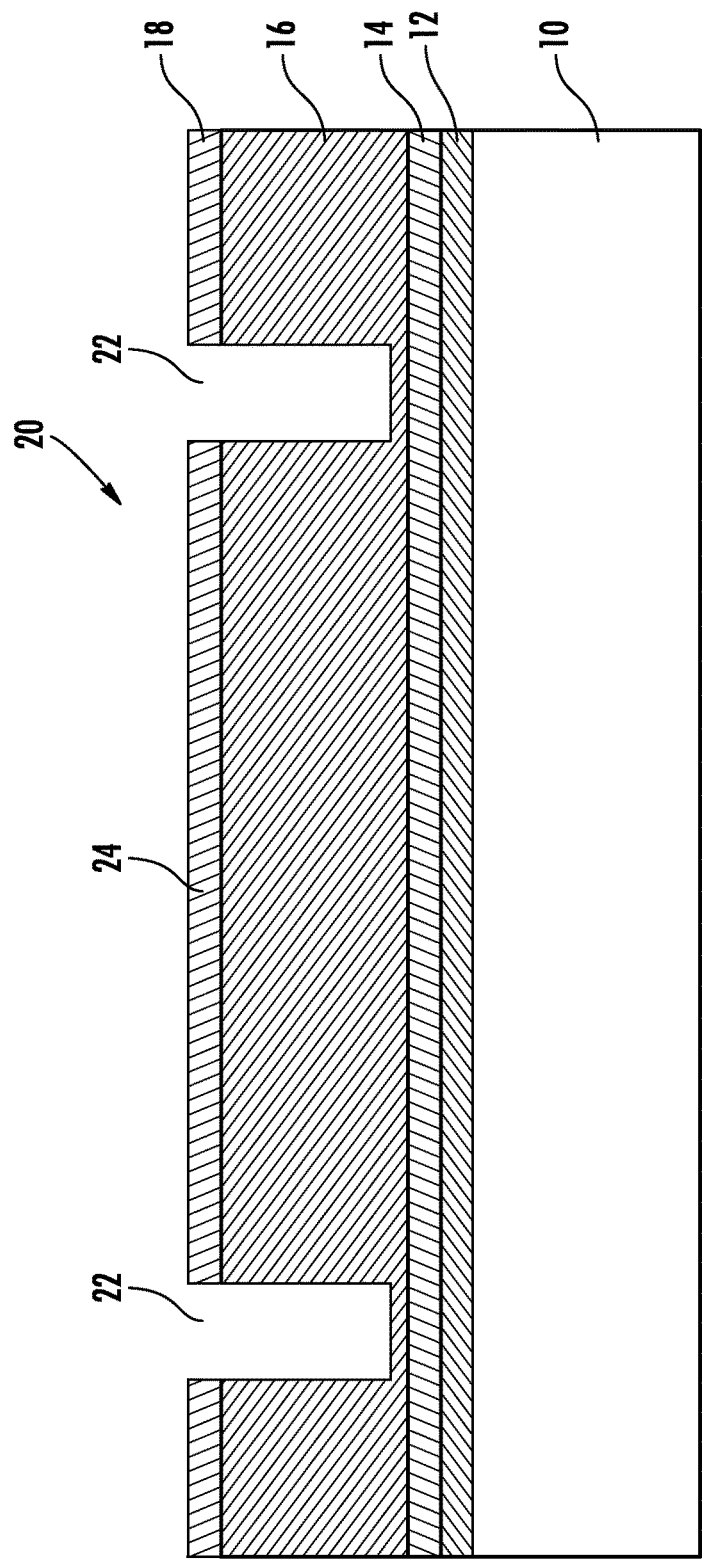
Figure 3:
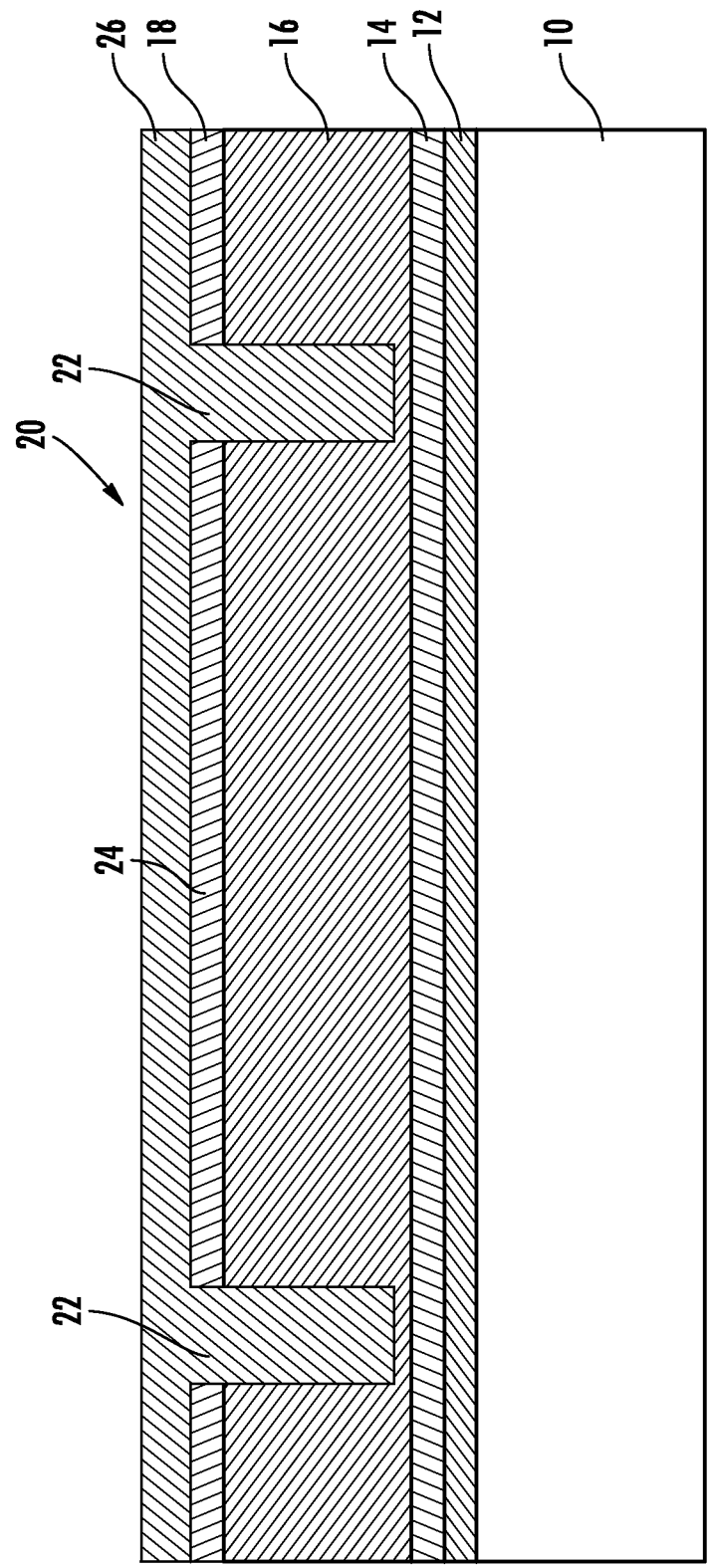

Turning to FIG. 2, the structure illustrated and described in conjunction with FIG. 1 is patterned (first mask step) into an array of individual PIN diodes with separate top contacts. In this process deep trenches 22 are etched through layer 18 and layer 16 for isolation but the etching stops short of layer 14 in this embodiment. In the present illustration only one photodiode 20 (sensor element) of the array will be shown in its entirety for simplification of the drawings and disclosure. Photodiode 20 has a top contact 24. As illustrated in FIG. 3, the structure is planarized with a coating 26 of low-k dielectric material (with a dielectric constant below approximately 6 and preferably below approximately 4). Examples of low-k dielectric material that can be processed by a coating process (such as spin coating, slot coating, spray coating, etc.) include polymer PMGI, polystyrene, PMMA, or other type acrylic polymer, Polyethylene, polyimide, polyvinyl phenol (PVP), zeon, PET, PEN, PES, PAN, BCB, SU8, silane- or siloxy-lane based, metallo-organic based (such as magnesium-based, or copper-based) compounds, spin on glasses, grapheme oxides and other combinations in blend or multi-layer form. It will be noted that trenches 22 are formed as deep as practical in this preferred embodiment (only upper layer 18 could be etched to separate the photodiodes) so that the low-k dielectric material is very thick in the trench area. The method of patterning such low-k material is well known to experts in the field, either wet-etching or dry-etching can be used.

Figure 4:
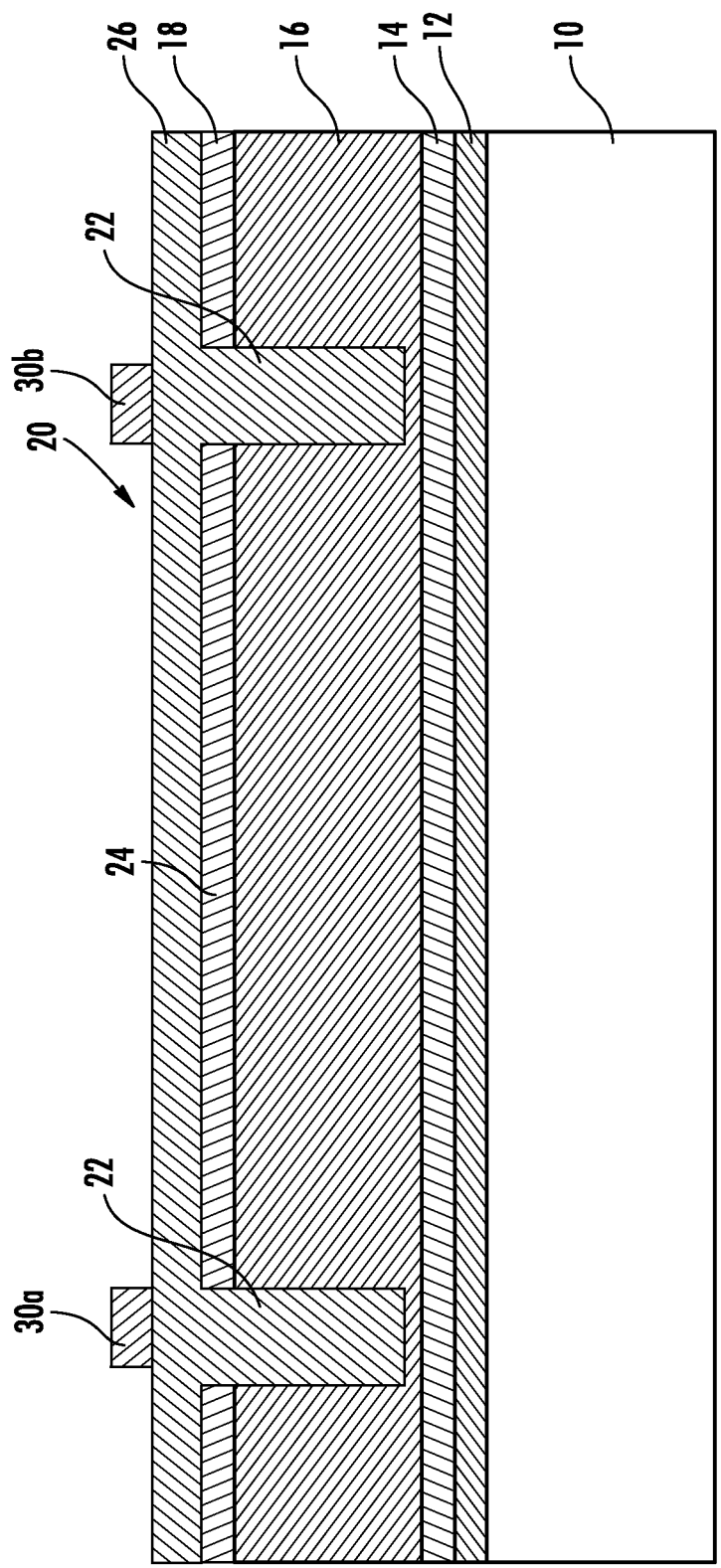

Referring additionally to FIG. 4, gate metal 30 is deposited and patterned ($2^{nd}$ mask step) onto planarizing coating 26. Here it should be understood that gate electrodes, designated 30a in FIG. 4, are deposited on the array with one each defining a TFT in conjunction with each photodiode in the array. Also, gate lines and data lines, represented by 30b in FIG. 4, are deposited in overlying relationship to trenches 22. The gate lines and the data lines are positioned over trenches 22 so that the thick low k dielectric material 26 substantially reduces coupling capacitance between gate metal 30 and bottom or common contact 12.

Figure 5:
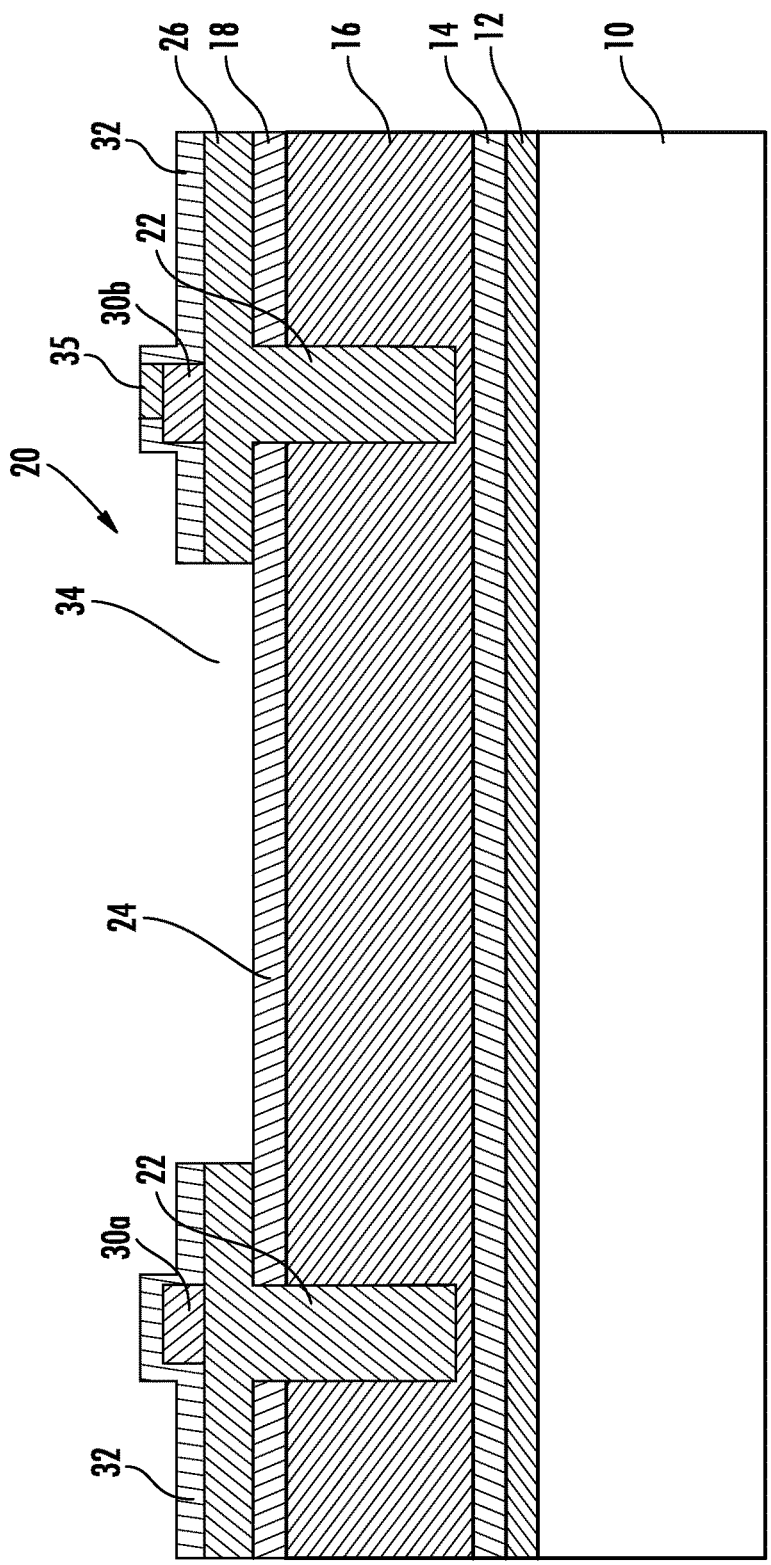

Referring now to FIG. 5, a blanket gate dielectric layer 32 is deposited over the structure. Vias 34 are opened through gate dielectric layer 32 and through planarizing coating 26 to expose an upper surface of top contact 24 of photodiode 20 and each of the other photodiodes in the array. This is the third masking step in the process. It should be noted that an opening or via, designated 35, can also be provided in this third masking step to the adjacent line 30 to provide for external connections that will be shown later and understood from the description.

Figure 6:
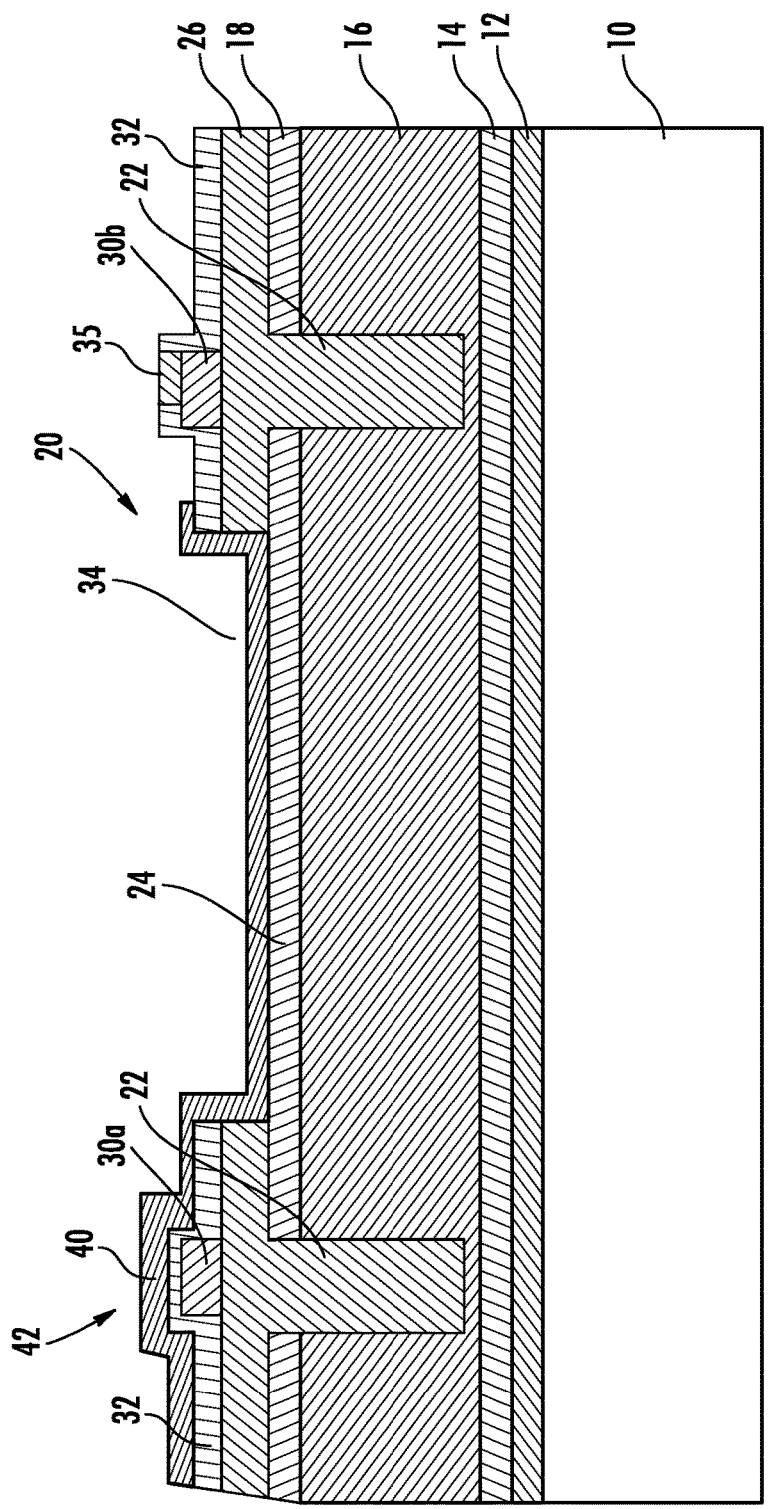

Referring to FIG. 6 a metal oxide semiconductor layer 40 is deposited as a blanket layer and patterned ($4^{th}$ mask step) to form the channel for a TFT 42 and to overlie and contact the top contact 24 of photodiode 20. Metal oxide layer 40 is transparent to the radiation wavelengths sensed by the photodiodes. Some typical examples of transparent metal oxides include ZnO, InO, GaO, AlZnO, ZnInO, InAlZnO, InGaZnO, InSnZnO, ZnSnO, GaSnO, GaInO, InGaSnO, InGaCuO, InCuO, CuZnO, GaCuO, GaZnO, AlCuO, etc. and their combinations. The, metal oxide semiconductor layer 40 may be in either amorphous or polycrystalline form. However, amorphous or nanocrystalline (grain size substantially smaller than TFT dimensions is preferred for uniformity of the image array.

Figure 7:
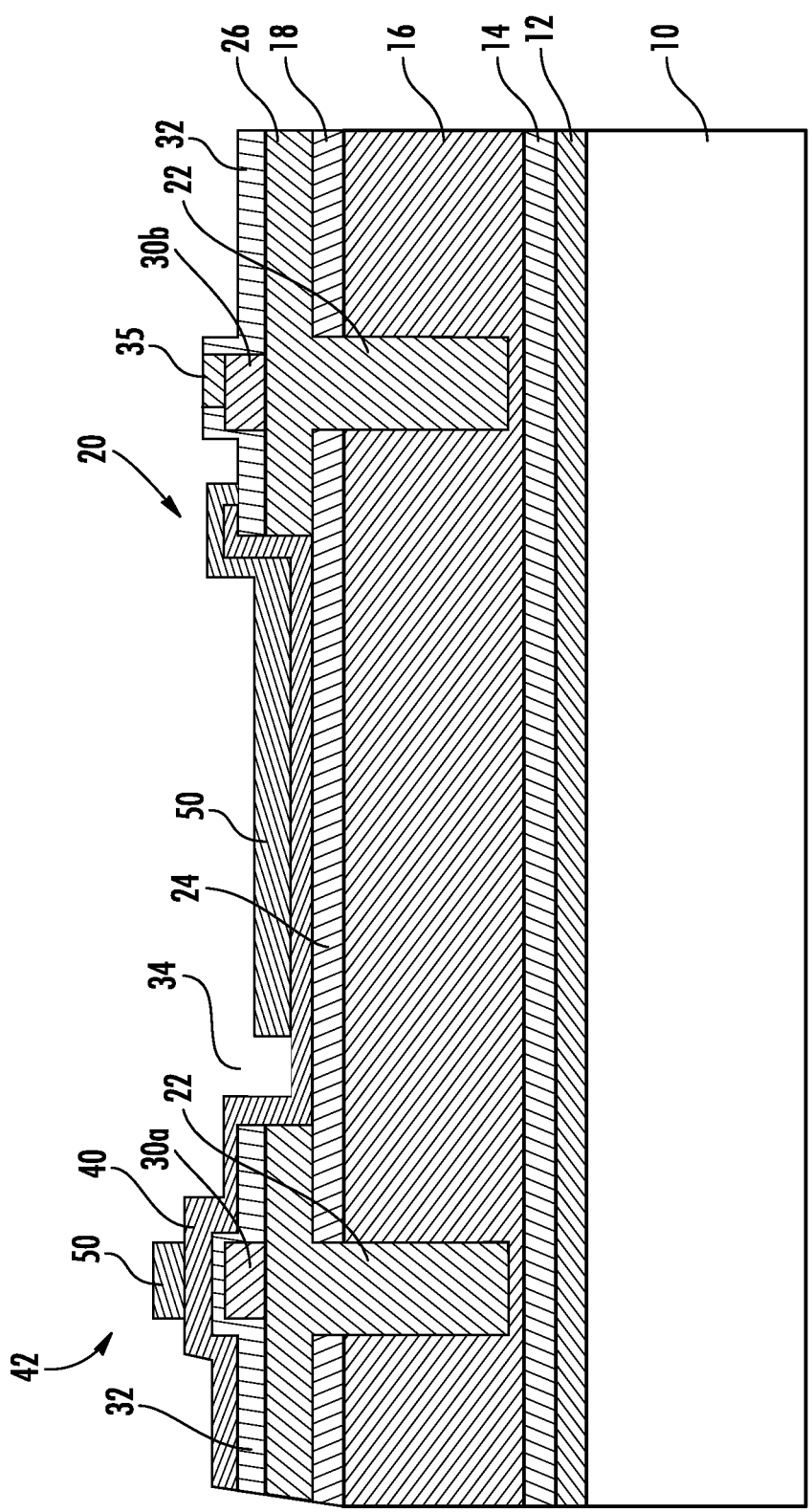

Turning to FIG. 7, an etch stop layer 50 is blanket deposited and patterned ($5^{th}$ mask step) to overlie gate 30 of TFT 42 and to overlie a major portion of top contact 24 of photodiode 20. Etch stop layer 50 is formed to define an active area in the metal oxide semiconductor material overlying gate electrode 30a. A blanket source/drain metallization layer is then deposited on the structure and patterned ($6^{th}$ mask step) to separate the metal layer into source/drain contacts 52/54 on opposite sides of the active area and to form a contact 56 with the adjacent gate line 30 through via 35. Etch stop layer 50 allows etching of the metallization layer without damaging metal oxide layer 40. In an alternative process to the TFT with an etch stop layer on top of the channel, the TFT can be made with a so-called back channel etching (BCE) method (sometimes referred to as "selective etching") by the proper selection of the channel material and the S/D etching process. That is by selecting the various materials the metallization layer can be etched without damaging metal oxide layer 40 and the extra step of patterning an etch stop layer can be eliminated.

Figure 8:
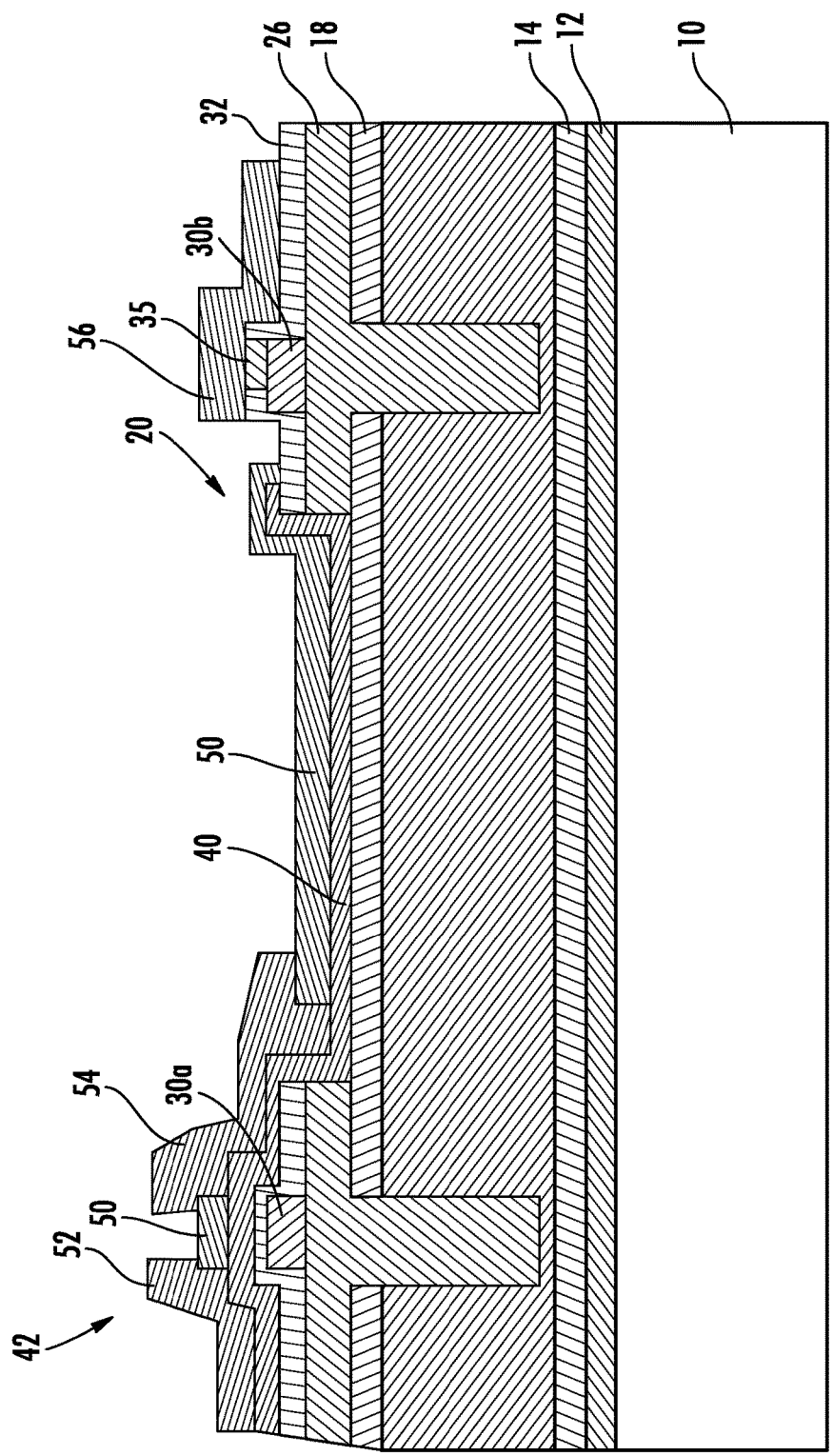
FIG. 8 is a simplified layer diagram illustrating the final imager in accordance with the present invention.

Referring specifically to FIG. 8, a simplified layer diagram of the final imager in accordance with the present invention is illustrated. Here it should be noted that metal oxide layer 40 serves as a transparent contact layer between TFT 42 and PIN diode 20. The transparent contact (metal oxide layer 400 between TFT 42 and photodiode 20) is defined by the metal oxide etch mask ($4^{th}$ mask step), the etch stop mask ($5^{th}$ mask step), and the S/D metallization etch mask ($6^{th}$ mask step). Thus, no additional deposition or masking steps are required to define the transparent top electrode of photodiode 20. It should also be noted that the portion of transparent contact layer (metal oxide layer 40) between TFT 42 and PIN diode 20 mostly overlies layer 18. Layer 18 has a tendency to absorb oxygen from metal oxide layer 40, thereby increasing the conductivity (carrier density) to render that portion of metal oxide layer 40 an electrical conductor (rather than a semiconductor). The portion of metal oxide layer 40 overlying the gate contact is adjacent gate dielectric layer 32, which does not affect the conductivity (i.e. absorb oxygen) so that the portion of metal oxide layer 40 defining the channel of TFT 42 remains a semiconductor. While element 20 is described as a photo-diode or PIN diode herein, it will be understood by those skilled in the art that element 20 can also be constructed as a radiation element or LED. Therefore, it should be understood that element 20 will be referred to as an "active element" which is defined as including either or both sensing and radiation functions.

It should be noted that the high mobility and stability metal-oxide TFT developed at CBRITE Inc. recently (U.S. Pat. Nos. 7,812,346, 8,907,336, 8,679,905, U.S. patent application Ser. Nos. 13/536641, 13/902,514, 14/081,130, 14/216,920) are especially promising for such project displays: (1) due to its high carrier mobility, the MOTFT provides sufficient pixel current for driving the light emitting element within each small pixel dimension, (2) the high energy gap, high quality metal-oxide semiconductor film used as the channel layer allows such MOTFT be driven in broad temperature range without performance change (Gang Yu et. Al., Symposium Digest of Society of Information displays, Vol. 43, p. 1123 (2012)).

Referring to FIGS. 9A and 9B a set of Id-Vgs curves are illustrated from MOTFT at 25° C. and 80° C. The data were taken from a TFT with W/L=6.7. The current switch ratio is beyond $10^{10}$ at Vgs=+/−10V, and the off current of such TFT shows no change when the substrate temperature is raised from room temperature to 80° C., independent of Vds bias. In fact, the off current collected in this data set was limited by the data collection setting. When take a slower I-V swapping speed, and using a more sensitive data collecting range, OFF current at $10^{-15}$ A independent to Vds in 0.1 to 10V range were revealed. In another test, the Id-Vg data were collected from −10° C. to 120° C. It was confirmed that the OFF current and the current switch ratio showed no change in such a broad range.

This temperature insensitive Id-Vgs is in sharp contrast to that in FETs made with crystalline wafers, and is a perfect candidate for driving LED emitters with high current density and for outdoor applications under harsh environmental conditions. At the operation current, the junction temperature of the PIN LED increases from its resting level (non-operation). The best TFT for constructing the pixel driver for LED displays should have a feature of driving current insensitive to substrate temperature at the pixel location.

Figure 10A:
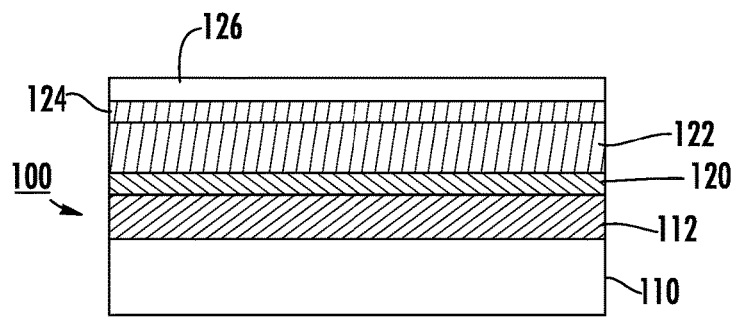
FIGS. 10A through 10D illustrate several steps in the process of fabricating an array of III-N pn LEDs.

Referring to FIG. 10A, the process starts with a GaN LED wafer 100 (while GaN is the preferred LED emission material and is used throughout this description, it will be understood that other III-V emission materials (in which III and V represent elements in $3^{rd}$ and $5^{th}$ columns of periodic table, e.g. GaN, InGaN, or AlInGaP} and combinations thereof may be used with proper structure for light emitting and includes an n-layer 112 deposited/grown on a transparent substrate 110, an emission layer 120 of GaN deposited/grown on n-layer 112, and a p-layer 122 deposited/grown on emission layer 120. It will be understood that while wafer 100 is illustrated and described as preferably including p-i-n semiconductor layers to form pin diodes, in some applications p-n semiconductor layers could be included to form simpler pn diodes. It should also be understood that while the term "wafer" is used to depict the overall structure, any wafer, portion of a wafer, chip, etc. may be used. A dry-etchable metal layer 124 (such as TiW) is then deposited on p-layer 122 as a first layer ohmic p-contact and a layer 126 of PECVD SiN is deposited on layer 124 as materials for an etch mask 128 shown in FIG. 10B.

Figure 10B:
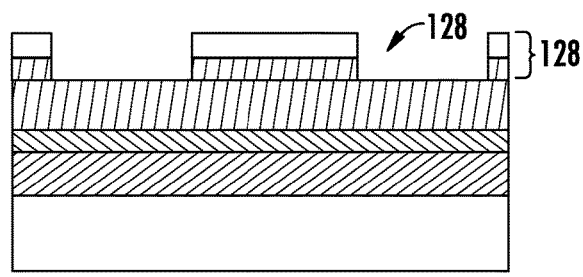
Figure 10C:
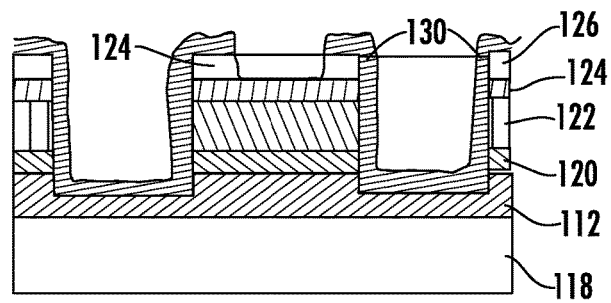

Referring to FIG. 10B, SiN and TiW layers 126 and 124 are patterned into an array of isolated islands, corresponding to an emission area of each display pixel and completing etch mask 128. This pattern is then transferred into GaN pn (or P-I-N in which the I refers to the emission layer with low carrier density which could be in a single composition layer or a stack of bi-layer with two different compositions, often called multiple quantum wells, MQW) LED structures as illustrated in FIG. 10C. In this process, etch mask 128 is used to etch LED wafer 100 partially into n-layer 112 by dry etch in chlorine containing gas in a dry etch (RIE or ICP) process.

Figure 10D:
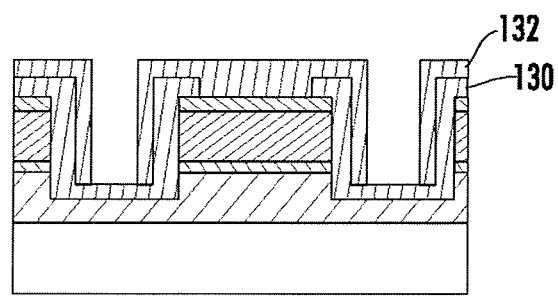

Referring to FIG. 10C, another layer 130 of PECVD SiN is then deposited on the surface of the structure and the SiN layer 130 and 126 on top of the dry-etchable metal layer 124 is patterned by photolithography and etched away. As illustrated in FIG. 10D, another layer 132 of metal reflecting material (e.g. Al, Au, Ag) is then sputtered onto the structure. Reflector layer 132 is then patterned into islands again by etching off a portion of the area overlaying the n-layer of the wafer (as shown in FIG. 10D). Patterned reflective metal layer 132 along with the dry-etch metal layer 124 (see FIG. 10C) forms optical mirrors on sides and top of the islands, reflecting emitted light from the PIN junction and emitting the light out from the bottom side through the n-layer and the substrate.

The side wall of each patterned LED element does not need to be perpendicular to the PIN layers. It is known to experts in the field that one can form the side wall in a tilted angle with the PIN stack by etching control or by properly selecting the wafer crystalline surface. For example, one could achieve the top surface of the islands smaller (or larger) than the area near the foot (forming vertical keystone in cross section). Such non-vertical side wall can be used to optimize emission output from the LED array.

When pixel size is reduced, the emission efficiency at low current levels may be reduced due to competition of non-radiative recombination at the sidewall interface. To minimize such effect and optimize emission efficiency at a broad operation brightness range of interest, the thickness of the I layer used in the LED array is typically thinner than those used for high power LED lamps with large emitter size.

Proper surface treatment with plasma and annealing at elevated temperature on the pixel side wall before depositing SiN layer 130 in FIG. 10(C) can also be used for improved emission efficiency at low operation current.

Figure 11:
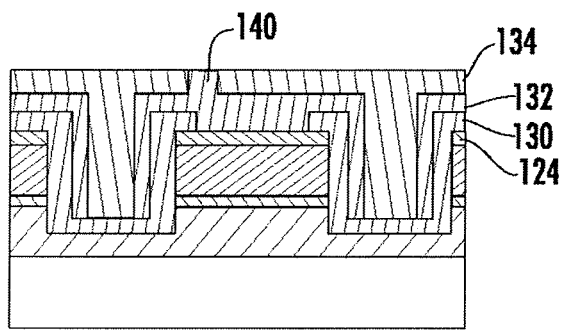
FIG. 11 illustrates the array of III-N pn LEDs of FIG. 10d after planarization.

Referring to FIG. 11, the wafer is then planarized with a layer 134 of a proper dielectric (either organic or inorganic or both) and a via 140 is formed through planarization layer 134 for each pixel in the array, which provides a contact to each PIN diode in the array.

Figure 12:
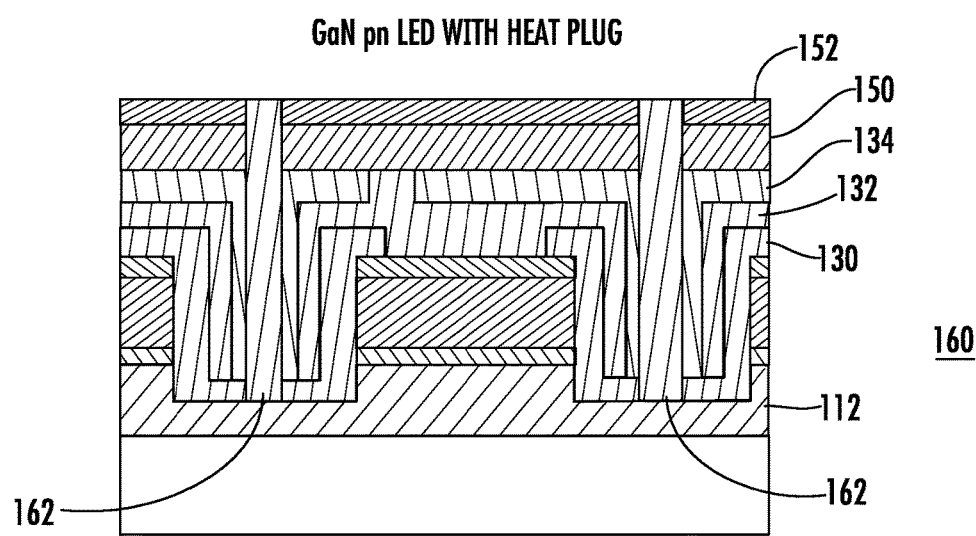
FIG. 12 illustrates the fabrication of a heat distribution system after the fabrication of a TFT array on the LED array of FIG. 11.

Referring to FIG. 12, a MOTFT backplane (designated 150) can be fabricated directly on planarization layer 134 using the process steps explained above with respect to FIGS. 4-8. Also, a passivation layer 152 is generally formed over the entire wafer. As will be understood, via 140 is positioned in electrical contact with metal oxide semiconductor layer 40 so that each TFT of each associated pixel of MOTFT backplane 150 is in controlling contact with the PIN in the associated pixel of the array. The entire structure thus forms an Active Matrix Light Emitting Diode (AM-LED) array, generally designated 160 in FIG. 12.

As explained above, the high power density projector formed by the AMOLED produces sufficient heat to require some heat dissipation. Further, as will be understood the heat dissipation has to go through some type of heat spreader. Most heat spreaders include some high heat conduction material (e.g. metal) and are not transparent and therefore a normal heat spreader can only be thermally connected to the upper side of MOTFT backplane 150. The dielectric layer(s) of MOTFT backplane 150 and passivation layer 152 are not a good thermal conductor(s). Heat plugs 162 are therefore introduced in AMLED array 160 to be used for high power density applications.

Referring to FIG. 12 heat plug 162 is made with a metal material which connects directly with the n-layer 112 of the LED and is isolated from the rest of the electronics by planarization layer 134. Heat plug 162 extends upwardly through MOTFT backplane 150 and passivation layer 152 and can therefore be connected to a heat spreader and/or heatsink (not shown) preferably positioned on passivation layer 152. The heat spreader, because of voltage on n-layer 112 of the LED, is held at a fixed voltage. Metal heat plug 162 is preferably thermally connected directly with any intermediate thin film dielectric in MOTFT backplane 150 because the thermal conductivity of any dielectric is at least two orders of magnitude smaller than that of metal. Heat plug 162 extends beyond MOTFT backplane 150 and is electrically isolated from MOTFT backplane 150 by passivation film 152. Heat plug 162 can also serve as a common cathode for the III-V LED array.

It will be understood that each pixel driver in MOTFT backplane 150 of AMLED array 160 can be made with at least two MOTFTs and one storage capacitor (2T1C). More complicated pixel circuits with additional MOTFTs, buslines, and capacitors can also be incorporated and used. Many pixel circuit designs for thin film organic light emitting diode (OLED) arrays have been proposed in the past decades for compensating either large size inhomogeneity or performance degradation in transistors or in OLEDs. Similar design principles can also be used for the pixel circuit used in AMLED array 160 disclosed herein. It should be noted specifically that due to the superb current-voltage stability in the LED and in the MOTFT, simple 2T1C pixel drivers can be used for driving emitting elements made in the LED array.

Optional filters, micro-lens, or passivation layers can be deposited or laminated on top of the active element array. Some examples of a thin film passivation layer include $Al_2O_3$, $MgO$, $SiO_2$, $SiN$, or $PbO$, which can be formed by either sputter, or chemical vapor deposition (CVD). In the case of a high energy radiation detector array, a passivation layer with heavy elements in the periodic table (such as PbO) could be used as thin passivation as well as a radiation blocker. Transmission enhancement can also be achieved with a $MgO$, $MgF_2$ or a $SiO_2$ layer, or a layer of other type of low k dielectric material. An optical micro-lens array on top of each active element can be formed with a transparent material using a proper patterning and etching process.

Although a single TFT is used in describing the process disclosed, active pixel circuits with multiple TFTs and more buslines can be designed with the same principle. Only 1-2 more masks are needed for vias and wire connections. In addition to TFTs, capacitors can be made with the gate insulator and the electrode layers under and above. Resistors can be made with the semiconductor metal oxide. The pixilated imager disclosed in this invention can thus be generalized as comprising image pixels comprising a radiation element or sensing element plus an image readout circuit incorporated in or with the metal oxide TFT.

It will be understood that the TFT pixel electronics can be made transparent with transparent data lines and gate scan lines (lines to gates 30, not visible). Transparent data lines and gate scan lines are especially important for high density imagers where the pixels are very small and the fill factor can become very small if opaque data lines and gate scan lines are used. It should also be noted that arrays incorporating active pixels or passive pixels are both possible when using the present invention.

Although a top-sensing configuration is used in describing the method of fabrication and the structure of the pixilated image array, the same structure and configuration can be used for bottom-sensing imagers as well. For the same device to be used for bottom-sensing or even bi-directional sensing, the bottom electrode and the substrate are formed of material transparent to the wavelength range it is desired to sense. When needed, the substrate can also be thinned to a desired thickness substantially smaller than the dimensions of the image pixels. By combining the functions of top-sensing and bottom-sensing, an image array with radiation sensitivity from both sides can be achieved.

With the device structure and process flow, a sensor array with multiple detection bands (such as visible and infrared) can also be achieved. For example, a dual-band sensor array with image element in p-i1-n-i2-p or n-i1-p-i2-n form can be fabricated. This image element essentially forms two p-i-n diodes coupled in series. In this structure the detection band can be selected by flipping the biasing polarity between the bottom electrode and the top electrode. In this biasing scheme, one p-i-n diode is selected or connected in reverse biasing and sensing mode while the other one is connected in a forward biasing mode, thereby providing a conductive path. In addition to the vertical arrangement described, the multiple band sensing elements can alternatively or additionally be arranged in the same latitude. The band selection can be accomplished by means of a selection switch that flips the bias on all of the dual band sensor elements in the dual-band sensor array.

The present invention, which is described in more detail below, provides new and improved processes for fabricating a top illumination-bottom imager with a MOTFT array for use in large size, high pixel density image arrays and/or for fabricating projector (light emitting) display devices in which each pixel comprises a MOTFT pixel driver circuit constructed with a MOTFT over a light emitting display element in the PIN stack. The new and improved processes for fabricating an imager uses a fewer number of process steps that are simple to perform. Also, the new and improved processes for fabricating an imager (sensing/radiating) substantially reduces coupling capacitance between data lines and scan lines and the common electrode. Further, a new and improved process for fabricating large area imagers as disclosed in the present invention provides new and improved imagers and especially large area imagers.

The LED array used in this projector display consists of M×N LEDs where each LED can be driven independently to create the display image. In contrast to passive matrix driving methods used in LED tiles (typically in 16×16 to 64×64 formats for each tile) which has been used for outdoor commercial display screens in the public arena, active matrix driving schemes with MOTFT pixel drivers is disclosed here for driving a high pixel density LED array in M rows and N columns with M and N substantially beyond 100 (e.g. several hundred to thousands).

For a small GaN LED to be efficient, the LED has to be surrounded by reflecting surfaces on all sidewalls other than the emitting surface. A simple process to create an array of efficient LEDs with such structure is described in detail below.

The following description discloses in more detail the use of the above described structure as a light emitting structure as well as a sensing structure.

Referring to FIG. 10, several steps (FIGS. 10A through 10D) in a process for fabricating a GaN LED wafer with proper structure for light emitting are illustrated (N layer/emission layer/P layer is illustrated in FIG. 10A as an example). Describing the process generally, the LED wafer is deposited with a dry-etchable metal layer (such as TiW) on top as the first layer ohmic p-contact (See FIG. 10A). Then a layer of PECVD SiN is deposited as the etch mask (FIG. 10A). The SiN and TiW layer are then patterned into isolated islands corresponding to an emission area of each display pixel (FIG. 10B). This pattern is then transferred into GaN pn (or P-I-N in which the I refers to the emission layer with low carrier density) LED structure partially into the n-layer by dry etch in chlorine containing gas in dry etch (RIE or ICP) (See FIG. 10C). Another layer of PECVD SiN is then deposited and the SiN on top of the dry-etchable metal is then patterned by photolithography and etched away (FIG. 10D). Another layer of metal reflector (Al, Au, Ag) is then sputtered onto the structure. The reflector layer is patterned into islands again as shown in FIG. 10d. The wafer is then planarized with proper dielectric (either organic or inorganic or both) with via and MOTFT backplane can be built on top of it as shown in FIG. 11.

For maximum efficiency, the heat dissipation is directed through a heat spreader. Most heat spreaders are not transparent and therefore heat spreaders can only be connected to the side of the driver electronics. The dielectric layer(s) and passivation layer used in a TFT stack is(are) not a good thermal conductor(s). A heat plug is therefore introduced in the AMLED array to be used for high power density applications.

In FIG. 12 a heat plug is illustrated that is made with a heat conductive metal material which connects directly the N-layer of the LED and is isolated from the rest of the electronics. The heat plug is therefore connected to a heat spreader on top of TFT circuit because of voltage on the n-layer of the LED is held at a fixed voltage. The metal heat plug is connected directly with any intermediate thin film dielectric because the thermal conductivity of any dielectric is at least two orders of magnitude smaller than that of metal. The heat plug will extend beyond the TFT plane and the heat spreader is electrically isolated from the TFT backplane by the passivation film shown in FIG. 12. The heat plug can also serve as the common cathode for the GaN LED.

The active matrix pixel driver can be made with at least two MOTFT and one storage capacitor (2T1C). More complicated pixel circuits with additional MOTFTs, bus-lines, and capacitors can also be used. Many pixel circuit designs for thin film organic light emitting diode (OLED) arrays have been proposed in the past decades for compensating either large size inhomogeneity or performance degradation in transistors or in OLED. Similar design principles can also be used for the pixel circuit used in the AMLED array disclosed in this application. It should be noted specifically that due to the superb current-voltage stability in the LED and in the MOTFT, simple 2T1C pixel drivers can be used for driving emitting elements made with LED arrays.

When the AMLED array is designed with 50 um pixel pitch, a high-definition (HD) AMLED array (1280×768~$10^6$ pixels) and a full HD (1920×1080~2.1×$10^6$ pixels) AMLED arrays can be achieved in 64 mm×38.4 mm and in 96 mm×54 mm sizes. Projectors for indoor home theater size can be made with smaller pixel pitch in a 10-50 um range.

Such high information content displays are typically made in full-color form. Two approaches can be used for achieving full-color: (1) For projectors aiming for relatively small screen or low ambient light environment, one could use the blue screen made with GaN LED array, and a color filter wheel with luminescent color filters converting the blue color into green and red color at different frame time. It is called RGB color sequencing, and has been known to experts in the field; (2) For high power projectors for commercial cinemas, sport arenas or side-wall of high-rise buildings, one could integrate three AMLED arrays with blue, green and red colors into a single optical system. The green color AMLED can be either achieved with LED array with green emission color (such as InGaN/GaN-based), or with a blue LED array plus a sheet of green luminescent filter. The red color AMLED can be either achieved with LED array with red emission color LED (such as AlInGaP-based), or with a blue LED plus a sheet of red luminescent filter. This full-color method has also been known to experts in the field.

In general, the device architectures disclosed in U.S. Pat. No. 8,962,377, in U.S. patent application Ser. No. 14/620,910, and in this application can be expended for other applications. For example, one can integrate a readout circuit array with MOTFT over a CMOS image array made with a silicon wafer, or multiple wafer tiles with pixel pitch of 1-2 um, billion pixel image arrays can be achieved with large field of view and with a selectivity to special area and variable resolutions. Similar concept can also be used for AMLED arrays. When the bottom wafer is replaced with other types of sensor arrays, or Si-wafer based integrating circuits, stacking type integrating circuits can be achieved for many different applications.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same,

The invention claimed is:

1. A method of fabricating a pixelated imager comprising the steps of:
   providing a substrate with a bottom contact layer and active element blanket layers deposited or grown on the bottom contact layer; thereafter
   separating the active element blanket layers into an array of active elements with trenches isolating adjacent active elements in the array; thereafter
   forming a dielectric passivation/planarization layer over the active element array; and
   forming an array of active element readout circuits overlying the passivation/planarization layer directly above the trenches, one active element readout circuit of the array of active element readout circuits coupled to each active element of the array of active elements, wherein the readout circuit coupled to each active element includes at least one thin film transistor with an active channel positioned above a gate dielectric layer comprising a metal-oxide semiconductor material.

2. A method as claimed in claim 1 further comprising forming a transparent conducting metal-oxide layer overlying the top of each active element.

3. A method as claimed in claim 1 wherein the pixelated imager is fabricated to be sensitive to one of top illumination, bottom illumination, or both top illumination and bottom illumination.

4. A method as claimed in claim 3 wherein the substrate and bottom contact layer are transparent to sensing wavelengths of the active elements.

5. A method as claimed in claim 1 wherein the step of forming at least one thin film transistor with an active channel comprising a metal-oxide semiconductor material includes forming a layer of metal oxide semiconductor material that is transparent to sensing wavelengths of the active elements.

6. A method as claimed in claim 5 wherein the step of forming a layer of metal oxide semiconductor material that is transparent to sensing wavelengths of the active elements includes a transparent metal oxide semiconductor material that is one of amorphous or polycrystalline.

7. A method as claimed in claim 1 wherein the step of forming an array of active element readout circuits overlying the passivation/planarization layer includes forming data lines and gate scan lines overlying the isolating trenches.

8. A method as claimed in claim 1 wherein the step of providing the active element blanket layers includes providing p-n junction photodiode blanket layers deposited or grown on the bottom contact layer and the step of separating the active element blanket layers into the array of active elements includes separating the p-n photodiode blanket layers into an array of photodiodes with trenches isolating adjacent photodiodes in the array.

9. A method as claimed in claim 8 wherein the step of providing the substrate with the p-n junction photodiode blanket layers includes providing a lower layer of semiconductor material having one of p-type and n-type conductivity and an overlying layer of semiconductor material having the other of n-type and p-type conductivity forming a p-n junction.

10. A method as claimed in claim 9 wherein the step of providing a lower layer of semiconductor material and an overlying layer of semiconductor material includes depositing a layer of intrinsic material between the lower layer and the upper layer to form one of a PIN or NIP junction diode.

11. A method as claimed in claim 10 wherein the step of providing the substrate with the PIN or NIP junction diode blanket layers includes one of p-i1-n-i2-p layers or n-i1-p-i2-n layers.

12. A method as claimed in claim 11 wherein the step of providing the substrate with the PIN or NIP junction blanket active layers including at least one of silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or their combinations in either amorphous or crystalline form.

13. A method as claimed in claim 10 wherein the step of separating the active element blanket layers into an array of active elements with trenches includes forming the trenches through the overlying layer of semiconductor material into a portion of the layer of intrinsic material.

14. A method as claimed in claim 1 wherein the step of forming a dielectric passivation/planarization layer over the active element array includes coating PMGI, polystyrene, PMMA, or other type acrylic polymer, polyethylene, polyimide, polyvinyl phenol (PVP), zeon, PET, PEN, PES, PAN, BCB, SU8, silane- or siloxy-lane based, metallo-organic based compounds, spin on glasses, graphene oxides, or their combinations in blend or multi-layer form.

15. A method as claimed in claim 1 wherein the step of forming an array of active element readout circuits includes forming each active element readout circuit of the array of active element readout circuits with at least one thin film transistor with active channel including one of ZnO, InO, AlZnO, ZnInO, InAlZnO, InGaZnO, InSnZnO, ZnSnO, GaSnO, InGaCuO, InCuO, CuZnO, GaCuO, GaZnO, AlCuO or combinations thereof.

16. A method as claimed in claim 1 further comprising a step of placing a scintillator layer between radiation incident on the array of active elements and the upper surface of the active elements.

17. A method as claimed in claim 1 further comprising forming an electrically insulating passivation and/or optical enhancement layer over the active element array.

18. A structure including a pixelated imager comprising:
a substrate with a bottom contact layer and active element blanket layers deposited on the bottom contact layer;
the active element blanket layers being separated into an array of active elements with trenches isolating adjacent active elements in the array;
a dielectric passivation/planarization layer over the array of active elements; and
an array of active element readout circuits overlying the passivation/planarization layer directly above the trenches, one active element readout circuit of the array of active element readout circuits coupled to each active element of the array of active elements, each active element and coupled active element readout circuit defining a pixel and the array of active elements and the coupled array of active element readout circuits defining a pixelated imager, and wherein the readout circuit coupled to each active element includes at least one thin film transistor with an active channel positioned above a gate dielectric layer comprising a metal-oxide semiconductor material.

19. A structure as claimed in claim 18 further comprises a transparent conducting metal-oxide layer overlying the top of each active element.

20. A structure as claimed in claim 18 wherein the active element blanket layers include a lower semiconductor layer an overlying upper semiconductor layer and a layer of intrinsic material between the lower layer and the upper layer forming a PIN or NIP diode active element.

21. A structure as claimed in claim 18 wherein the active element blanket layers include p-n photodiode blanket layers positioned on the bottom contact layer and the p-n photodiode blanket layers are separated into an array of photodiodes with trenches isolating adjacent photodiodes in the array.

22. A structure as claimed in claim 21 wherein the p-n junction blanket layers include a lower layer of semiconductor material having one of p-type and n-type conductivity and an overlying layer of semiconductor material having the other of n-type and p-type conductivity forming a p-n junction.

23. A structure as claimed in claim 18 wherein the active element blanket layers include a lower layer of semiconductor material and an overlying layer of semiconductor material and further include a layer of intrinsic material between the lower layer and the upper layer to form a PIN or NIP diode.

24. A structure as claimed in claim 18 wherein the active element blanket layers include one of p-i1-n-i2-p layers or n-i1-p-i2-n layers.

25. A structure as claimed in claim 23 wherein the active element blanket layers separated into an array of active elements with trenches includes the trenches extending through the overlying layer of semiconductor material into a portion of the layer of intrinsic material.

26. A structure as claimed in claim 18 wherein the array of sensing element readout circuits overlying the passivation/planarization layer further includes data lines and gate scan lines overlying the isolating trenches.

27. A structure as claimed in claim 26 wherein a planarizing layer is positioned in the trenches beneath the gate electrode and the data lines and gate scan lines of the array of pixel readout circuits.

28. A structure as claimed in claim 27 wherein the passivation/planarizing layer includes one of polymer PMGI, polystyrene, PMMA, or other type acrylic polymer, polyethylene, polyimide, polyvinyl phenol (PVP), zeon, PET, PEN, PES, PAN, BCB, SU8, silane- or siloxy-lane based, metallo-organic based compounds, spin on glasses, graphene oxides, or their combinations in blend or multilayer form.

29. A structure as claimed in claim 19 wherein the layer of metal oxide semiconductor material includes a layer of metal oxide semiconductor material that is transparent to sensing wavelengths of the active elements.

30. A structure as claimed in claim 18 wherein the layer of metal oxide semiconductor material includes at least one of ZnO, InO, AlZnO, ZnInO, InAlZnO, InGaZnO, InSnZnO, ZnSnO, GaSnO, InGaCuO, InCuO, CuZnO, GaCuO, GaZnO, AlCuO or their combinations.

31. A structure as claimed in claim 30 wherein the metal oxide semiconductor material is in amorphous and/or polycrystalline form.

32. A structure as claimed in claim 18 wherein the substrate with the active blanket layers include at least one of silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or their combinations in either amorphous or crystalline form.

33. A structure as claimed in claim 18 further comprising a scintillator layer positioned between radiation incident on the array of active elements and the upper surface of the active elements.

34. A structure as claimed in claim 18 wherein the active element readout circuit forms a passive pixel sensor.

35. A structure as claimed in claim 18 wherein the active element readout circuit forms an active pixel sensor.

36. A structure as claimed in claim 18 further including an electrically insulating passivation and/or optical enhancement layer over the pixelated imager.

37. A structure as claimed in claim 36 wherein the electrically insulating passivation and/or optical enhancement layer over the pixelated imager include one of Al2O3, MgO, SiO2, SiN, PbO or their combinations in stack or blend form.

* * * * *